United States Patent [19]

Ikeda

[11] Patent Number: 5,708,376
[45] Date of Patent: Jan. 13, 1998

[54] VARIABLE-GAIN AMPLIFYING DEVICE

[75] Inventor: Chikaho Ikeda, Nakai-machi, Japan

[73] Assignee: Fuji Xerox Co., Ltd., Tokyo, Japan

[21] Appl. No.: 672,032

[22] Filed: Jun. 26, 1996

[30] Foreign Application Priority Data

Jul. 12, 1995 [JP] Japan .................. 7-200522

[51] Int. Cl.$^6$ ........................ H03F 1/02
[52] U.S. Cl. ................ 327/50; 327/52; 327/560; 327/561; 327/563; 327/337; 330/107; 330/294
[58] Field of Search .................... 327/50, 52, 560, 327/561, 562, 563, 337, 91, 94, 96, 554; 330/107, 294

[56] References Cited

FOREIGN PATENT DOCUMENTS

| 57-13168 | 3/1982 | Japan . |
|---|---|---|
| 1-19287 | 4/1989 | Japan . |
| 5-28525 | 4/1993 | Japan . |
| 6-164263 | 6/1994 | Japan . |

Primary Examiner—Timothy P. Callahan
Assistant Examiner—An T. Luu
Attorney, Agent, or Firm—Oliff & Berridge

[57] ABSTRACT

A variable-gain amplifying device uses different gains for amplifying an input bias voltage signal, and an input composite signal produced by superposing an input bias voltage signal on an input signal, respectively.

9 Claims, 7 Drawing Sheets

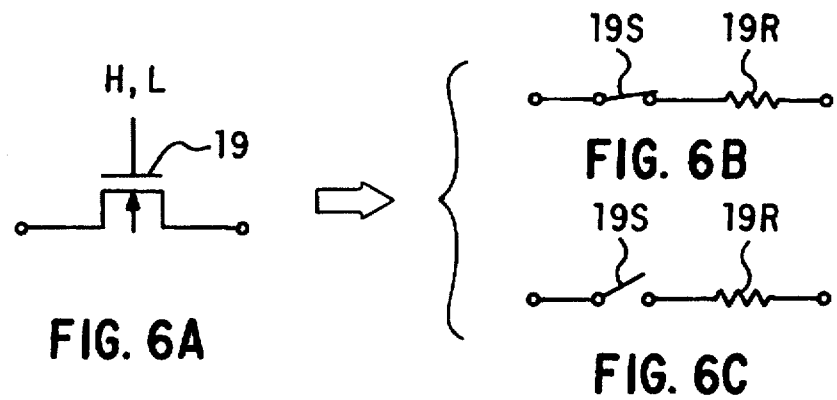
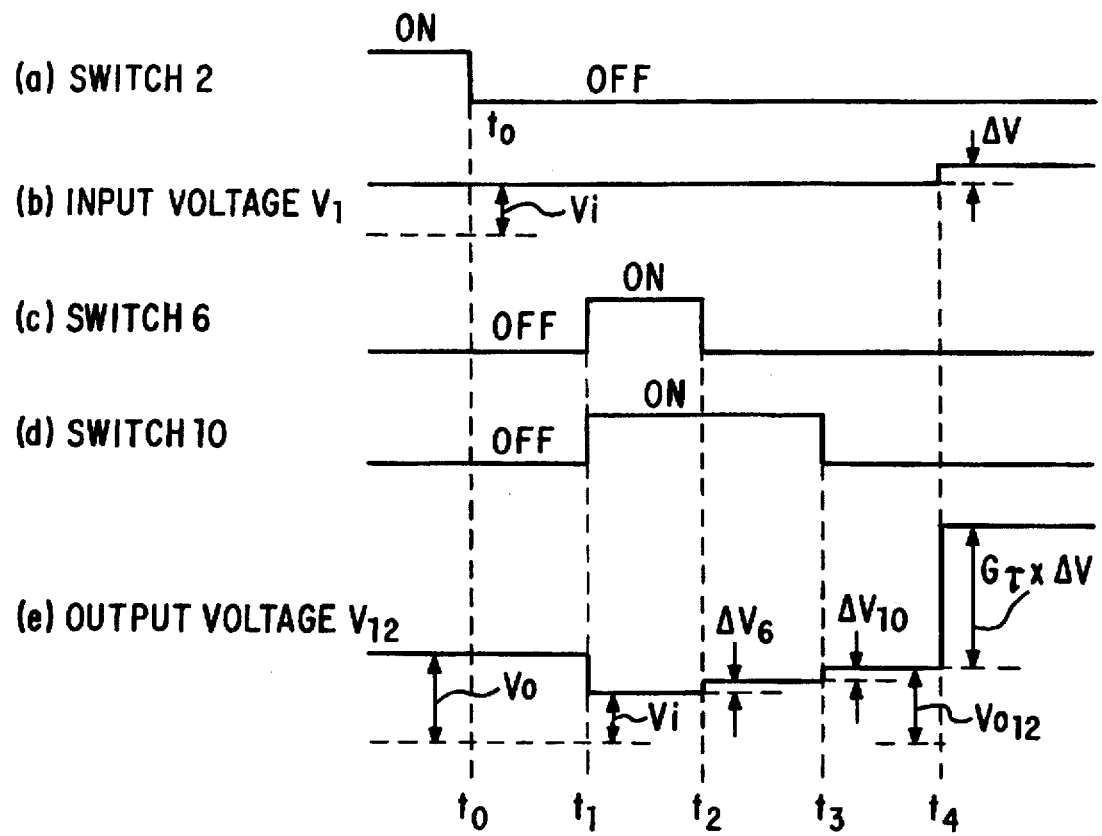
FIG. 7

VARIABLE-GAIN AMPLIFYING DEVICE

BACKGROUND OF THE INVENTION

1. Field of the Invention

The present invention relates to a variable-gain amplifying device that uses different gains for amplifying an input bias voltage signal, and an input composite signal produced by superposing an input bias voltage signal on an input signal, respectively.

2. Description of the Related Art

An input signal given to an amplifier often includes a dc component. When amplifying such an input signal, a wide dynamic range is necessary because the dc component takes up a large portion of the dynamic range. Particularly, in an operational amplifier having a large gain, the dynamic range increases easily beyond the maximum dynamic range. Therefore, a method of amplifying only the input signal employs dual correlation sampling. A variable-gain amplifier is used to carry out dual correlation sampling because the gain of the amplifier needs to be changed for dual correlation sampling.

Referring to FIG. 3 showing, by way of example, a variable-gain amplifying device suitable for dual correlation sampling, there are shown an input terminal 1, an input parasitic capacitance $C_i$, a switch 2, a bias power source 3, capacitors 4 and 5, a switch 6, an operational amplifier 7, a differential amplifier stage 7-1, an output amplifier stage 7-2 and an output terminal 15. This variable-gain amplifying device employs only the operational amplifier 7 as an amplifier.

Generally, an amplifier has two amplifying stages. The operational amplifier 7 consists of two amplifying stages, i.e., the differential amplifier stage 7-1 and the output amplifier stage 7-2. Noise entering the second and the following stages is reduced by negative feedback (the capacitor 5 and the witch 6). However, noise generated by the first amplifier stage cannot be reduced by negative feedback. Therefore, the first amplifier stage having a large transconductance $g_m$ is used as the differential amplifying stage 7-1 to reduce noise in the variable-gain amplifying device.

The capacitor 4 is connected across an inverting input terminal (−) and a ground (which is indicated by an earth mark for the sake of convenience but, actually, a fixed potential, which applies to other grounds), and the capacitor 5 and the switch 6 forming a negative feedback circuit are connected across the output terminal 15 and the inverting input terminal (−). The switch 6 is operated to change the gain. When the switch 6 is closed the gain is 10° (0 dB) because negative feedback is 100% and a known voltage follower circuit is established. When the switch 6 is opened, the gain is a value dependent on the capacity ratio between the capacitors 4 and 5. A noninverting input terminal (+) is connected to the input terminal 1 and an input signal is applied to the noninverting input terminal (+). The noninverting input terminal (+) is connected through the switch 2 to the bias voltage source 3.

Dual correlation sampling is performed in the following manner.

① First, the switch 2 is closed and is opened after a while. Thus, the input parasitic capacitor $C_i$ is charged by the bias power source 3 at a bias voltage substantially equal to the output voltage of the bias power source 3.

② Subsequently, the switch 6 is closed to set the gain to 1 (one). Then, a voltage obtained by amplifying the charged voltage of the input parasitic capacitor $C_i$ at a gain of 1 (one) appears at the output terminal 15. The voltage at the output terminal 15 is fed back for negative feedback to charge the capacitor 4 at a voltage substantially equal to the bias voltage.

③ Subsequently, the switch 6 is opened to set the gain to another value and an input signal is applied to the input terminal 1. Then, a composite signal obtained by superposing the input signal on the input bias voltage of the input parasitic capacitor $C_i$ is applied to the noninverting input terminal (+). Since the bias voltage has been applied to the inverting input terminal (−), the difference between the input bias voltage of the input parasitic capacitor $C_i$ and the composite signal, i.e., the input signal, is given to the differential amplifier stage 7-1, and the input signal is amplified at the predetermined gain. Thus, only the input signal is amplified.

Generally, the operational amplifier employs CMOSFETs when an analog switch employs a MOSFET for the purpose of cost reduction. When the operational amplifier comprises CMOSFETs, the gain of the differential amplifier stage is about 40 dB (100) and that of the output amplifier stage is about 40 dB and then the total gain is about 80 dB. Therefore, when a large gain greater than 80 dB is necessary, a circuit formed by connecting a plurality of operational amplifiers must be used.

Such a large gain is necessary, for example, when amplifying an image signal provided by an image sensor. When an image signal is amplified at a gain of 100 by an operational amplifier having a gain of 80 dB when negative feedback is not made, i.e., open-loop gain of 80 dB, the gain is set to 100 (40 dB) by negative feedback. Therefore, the loop gain is (80−40) dB=40 dB. The loop gain affects the accuracy of amplification. It is known that the accuracy of amplification includes an error on the order of 1% when the loop gain is 40 dB (100). The loop gain must be large for accurate amplification.

When converting an image signal provided by an image sensor into a corresponding digital signal by an 8-bit A/D converter, the image signal must be analyzed in 256 steps. Therefore, error in amplification must be 1/256 or below. Since 1/256 corresponds to 0.4%, error must be 0.4% or below and hence the loop gain must be about 50 dB or greater, which is greater than 40 dB for an accuracy of 1% error. Accordingly, the gain of the amplifier is about 90 dB (=40 dB+50 dB) or above. Since such a large gain is unavailable from one operational amplifier comprising CMOSFETs, an amplifying device comprising two amplifiers arranged in a cascade connection is necessary.

FIGS. 2A and 2B show conventional variable-gain amplifying devices for cases requiring the use of amplifiers having a large gain. In FIGS. 2A and 2B, parts like or corresponding to those shown in FIG. 3 are designated by the same reference characters. Shown in FIGS. 2A and 2B are capacitors 8 and 9, switches 10, operational amplifiers 11, output terminals 12 and a capacitor 13. The variable-gain amplifying device shown in FIG. 2A comprises two operational amplifiers similar to that shown in FIG. 3 arranged in a cascade connection. When the gain of each operational amplifier is N, the total gain of the variable-gain amplifying device shown in FIG. 2A is N×N. The variable-gain amplifying device shown in FIG. 2B is provided with a single capacitor instead of two capacitors individually for two amplifiers. The gain of the variable-gain amplifying device shown in FIG. 2B is dependent on the capacitance ratio between the capacitors 4 and 13.

The variable-gain amplifying devices shown in FIGS. 2A and 2B have the following problems.

In the variable-gain amplifying device of FIG. 2A, noise generated by the operational amplifier 11, i.e., an output operational amplifier cannot be suppressed because no negative feedback is made.

The variable-gain amplifying device of FIG. 2B has an excessively large loop gain, and needs a capacitor of a large capacitance to secure a phase margin to prevent oscillation. Therefore, this variable-gain amplifying device is expensive. Since switching noise generated when changing the gain is amplified by the cascaded operational amplifiers, the output level is shifted greatly.

If a differential amplifier having a large transconductance $g_m$ is employed as the input amplifier stage, the ratio in transconductance $g_m$ between the input and the output amplifier stages is small, the zero point of the transfer function is on the side of low-frequency range, and the phase margin is small and the stability is unsatisfactory, i.e., the variable-gain amplifier is liable to oscillate, which applies to all amplifying devices employing MOSFETs.

Those problems in the conventional variable-gain amplifying devices will be described in further detail. The first problem in the variable-gain amplifying device of FIG. 2B will be explained. Since the two operational amplifiers, i.e., CMOSFETs, are arranged in a cascade connection, the total gain is about 160 dB (=about 80 dB×2). Supposing that 40 dB is necessary for amplification, the loop gain is about 120 dB (=160 dB−40 dB). When the loop gain is large, it is difficult to secure the phase margin and a large-capacity capacitor is necessary for phase compensation to prevent oscillation. Such a large-capacity capacitor takes up a large area on an integrated circuit and increases the costs of the integrated circuit. If the phase compensating capacitor is limited to that of a cost in a reasonable cost range, available loop gain is on the order of 80 dB at the largest.

The second problem in the variable-gain amplifying device of FIG. 2B is that a switching noise ΔS applied to the input operational amplifier 7 is amplified and an amplified noise ΔS×N×N appears at the output terminal 12 when the gain of each operational amplifier is N, and the output level is shifted accordingly. When the operational amplifiers are CMOSFETs, a CMOSFET is employed as the switch. Such a switch generates noise resulting from injection charge injected through a parasitic capacitance from the gate when the switch is closed or opened.

SUMMARY OF THE INVENTION

The present invention provides a variable-gain amplifying device capable of solving the foregoing problems in the conventional variable-gain amplifying devices and comprising: a first differential amplifier having a positive-phase input terminal to which an input voltage is applied; a first capacitor for negative feedback connected across the inverted input terminal and the output terminal of the first differential amplifier; a first switch connected in parallel to the first capacitor; a second capacitor connected across the inverted input terminal of the first differential amplifier and a point of a fixed potential; an operational amplifier having a differential amplifying stage and an output amplifying stage, and having a positive-phase input terminal connected to the output terminal of the first differential amplifier; a second switch for gain switching connected across the inverted input terminal and the output terminal of the operational amplifier; a third capacitor connected across the inverted input terminal of the operational amplifier and a point of a fixed potential; and a fourth capacitor for negative feedback connected across the inverted input terminal of the first differential amplifier and the output terminal of the operational amplifier.

In the above device, the first and the second switches may be MOSFET analog switches. The total gain in a state with the first switch opened and the second switch closed may be approximately equal to the square root of the total gain in a state with both the first and the second switches opened. It is desirable, when opening the first and the second switches, to open the first switch first.

The variable-gain amplifying device may further comprise a first phase compensating circuit for changing the phase of the amplifier, comprising a phase compensating capacitor and a first MOSFET, the gate of the first MOSFET is controlled by a gain switching signal provided by operating the second switch for gain switching, the first phase compensating circuit changes the phase in response to the gain switching signal, and the first MOSFET acts together with the phase compensating capacitor as a nulling resistor for determining a cutoff frequency.

In the above device, a second MOSFET may be connected in parallel to the phase compensating capacitor, and the second MOSFET may be turned on when the first MOSFET is turned off.

The variable-gain amplifying device may further comprise a second phase compensating circuit connected in parallel to the first phase compensating circuit to set a phase compensating characteristic different from that set by the first phase compensating circuit for the variable-gain amplifying device. The first and the second phase compensating circuits may be used selectively or in combination according to the gain switching signal. The second phase compensating circuit may comprise only a capacitor.

The variable-gain amplifying device comprises an input amplifying stage having only the differential amplifier, and an output amplifying stage having the operational amplifier, and the input amplifying stage and the output amplifying stage are arranged in a cascade connection, and negative feedback is made for both the variable-gain amplifying device and the differential amplifier. The total gain of the variable-gain amplifying device is set by negative feedback for the variable-gain amplifying device, the gain of the input amplifying stage of the differential amplifier is determined by negative feedback for the differential amplifier, and the gain of the operational amplifier corresponds to the difference between the total gain and the gain of the input amplifying stage of the differential amplifier.

Since the input amplifying stage and the differential amplifier are employed instead of two operational amplifiers arranged in a cascade connection, a loop gain determined by subtracting a gain used for amplification, which is smaller than the total open-circuit gain due to negative feedback, from the total gain, i.e., the sum of the respective gains of the differential amplifier and the operational amplifier (the sum of open-circuit gains) will not be excessively large. Therefore, the capacitance of the capacitor for securing a phase margin to prevent oscillation may be smaller than that necessary when two operational amplifiers are used. Consequently, the area for the capacitor and the costs are reduced.

Since negative feedback is made for the variable-gain amplifying device, noise generated by the output amplifying stage is suppressed. Since the switch for changing the gain of the differential amplifier is opened first and then the switch for changing the gain of the operational amplifier of the output amplifying stage is opened (gain is equal to 1) when opening both the switches for gain switching, noise generated when the switches are opened is amplified substantially only by the differential amplifier. The noise thus amplified only by the differential amplifier is far lower than that amplified by the input and the output amplifying stages. The switch for switching the gain of the operational amplifier, i.e., the output amplifying stage, is opened after the switch for switching the gain of the differential amplifier, and noise generated when the same switch is opened is amplified only by the operational amplifier. Consequently, the shift of the output level due to switching noise can be limited to a low extent.

Since 100% negative feedback is made for the differential amplifier when the gain is 10° at which oscillation is liable to occur, the open-circuit gain is substantially equal to only the gain of the operational amplifier even if the transconductance $g_m$ of the differential amplifier is large to reduce noise. Therefore, a phase margin can be secured, the variable-gain amplifying device is stabilized and oscillation occurs hardly.

Since the phase compensator of the operational amplifier is changed simultaneously with gain changing, the reduction of cutoff frequency can be limited to a small extent even when a larger gain is selected.

BRIEF DESCRIPTION OF THE DRAWINGS

The above and other objects, features and advantages of the present invention will become more apparent from the following description taken in connection with the accompanying drawings, in which:

FIGS. 6A, 6B and 6C are diagrams of assistance in explaining actions equivalent to those of a MOSFET;

FIG. 7 is a time chart of assistance in explaining the operation of the variable-gain amplifying device of FIG. 1;

DESCRIPTION OF THE PREFERRED EMBODIMENTS

Figure 1:
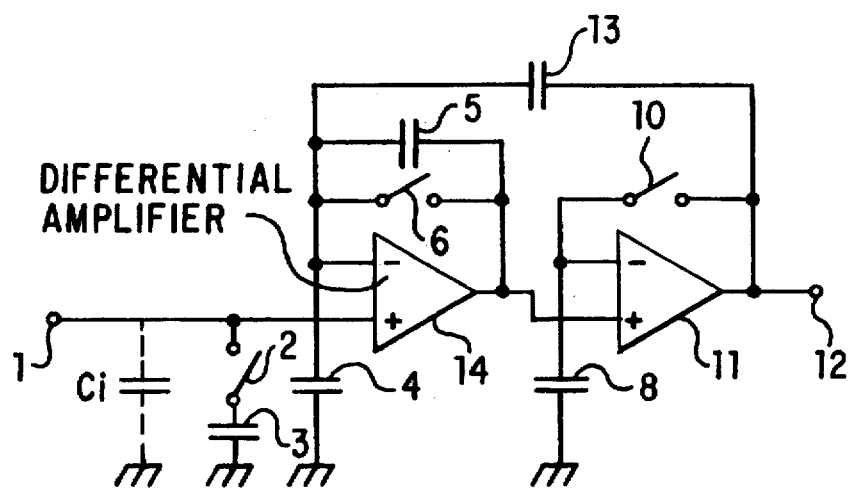
FIG. 1 is a circuit diagram of a variable-gain amplifying device in a preferred embodiment according to the present invention.
Figure 2A:
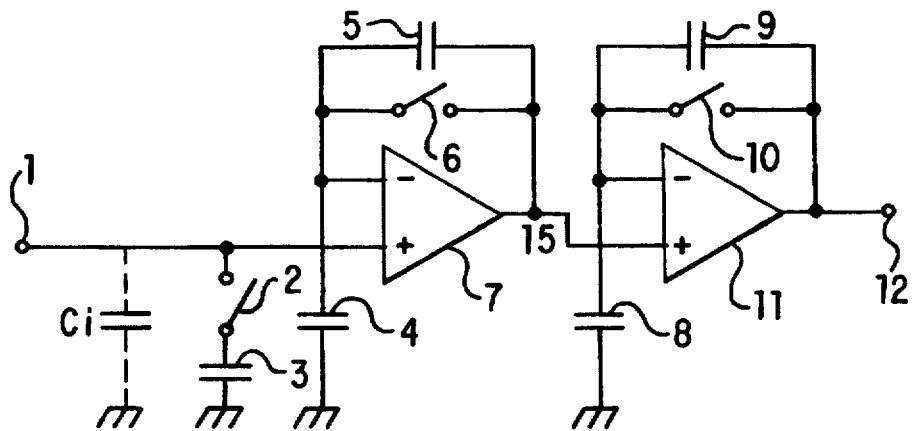
FIGS. 2A and 2B are circuit diagrams of conventional variable-gain amplifying devices having a high gain.
Figure 2B:
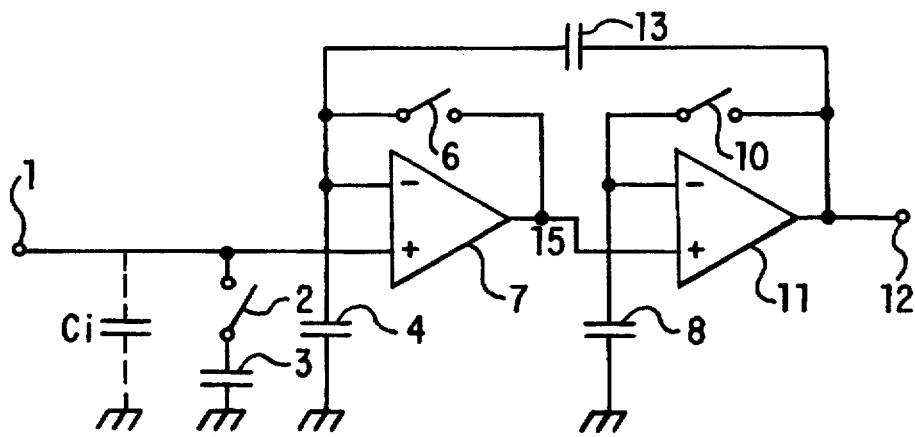
Figure 3:
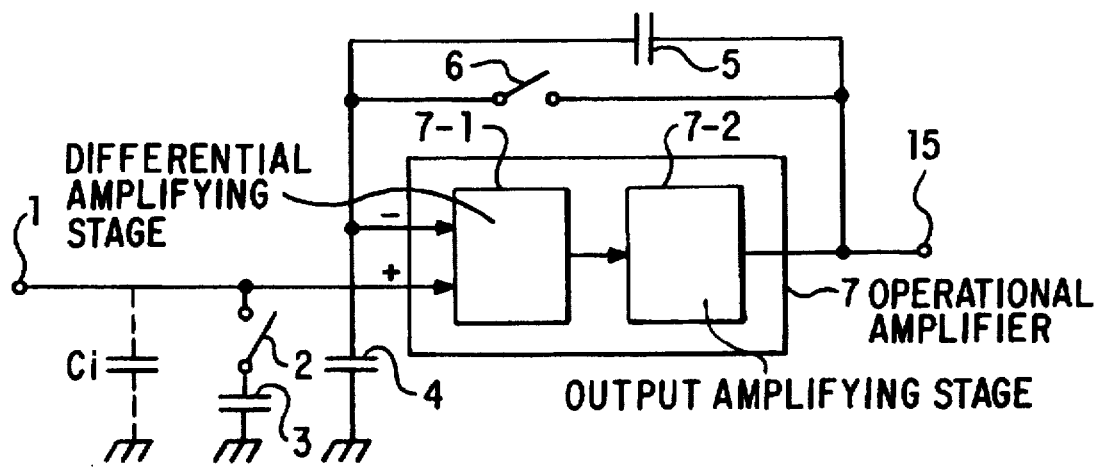
FIG. 3 is a circuit diagram of an example of a variable-gain amplifying device that carries out dual correlation sampling.

A variable-gain amplifying device in accordance with the present invention will be described with reference to FIG. 1, in which parts like or corresponding to those shown in and described with reference to FIGS. 2A and 2B are designated by the same reference characters. Referring to FIG. 1, a differential amplifier 14 comprising CMOSFETs is similar to the differential amplifying stage of an operational amplifier like an operational amplifier 11 comprising CMOSFETs. The gain of the differential amplifier 14 is about 40 dB, which is half the gain of an operational amplifier comprising CMOSFETs as explained previously with reference to FIG. 3.

This variable-gain amplifying device has the differential amplifier 14 and the operational amplifier 11, which are arranged in a cascade connection. A parallel circuit of a capacitor 5 for negative feedback and a switch 6 is connected across the inverted input terminal and the positive output terminal of the differential amplifier 14, a capacitor 4 is connected across the inverted input terminal of the differential amplifier 14 and a ground (a point of a fixed potential), an input voltage is applied to the noninverting input terminal of the differential amplifier 14, a switch 10 is connected across the inverted input terminal and the output terminal of the operational amplifier 11, a capacitor 8 is connected across the inverted terminal of the operational amplifier 11 and the ground, and a capacitor 13 for negative feedback is connected across the inverted input terminal of the differential amplifier 14 and the output terminal 12 of the operational amplifier 11.

When both the switches 6 and 10 are closed, both the gain $G_{14}$ of the amplifying stage of the differential amplifier 14 and the gain $G_{11}$ of the amplifying stage of the operational amplifier 11 are 10°, and hence the total gain $G_T$ of the variable-gain amplifying device is 10°. When both the switches 6 and 10 are open, the total gain $G_T$ of the variable-gain amplifying device is dependent on the ratio in capacitance between the capacitors 4 and 13, and the gain $G_{14}$ of the amplifying stage of the differential amplifier 14 is dependent on the ratio in capacitance between the capacitors 4 and 5. The gain $G_{11}$ of the amplifying stage of the operational amplifier 11 is equal to the remainder of subtraction of the gain $G_{14}$ of the amplifying stage of the differential amplifier 14 from the total gain $G_T$, i.e., $G_{11} = G_T - G_{14}$, due to total negative feedback.

The operation of the variable-gain amplifying device will be described with reference to FIG. 7.

(1) Operation with Bias Voltage

Suppose that the switch 2 is closed in an initial state, the input parasitic capacitance $C_i$ is charged by the bias power source 3 at a voltage $V_i$ substantially equal to a bias voltage, and the voltage $V_{12}$ at the output terminal 12 is equal to $V_0$.

The output voltage $V_{12}$ remains unchanged even if the switch 2 is opened at time $t_0$, because the voltage of the charged input parasitic capacitance $C_i$ is applied still to the noninverting input terminal (+) of the differential amplifier 14. When the switches 6 and 10 are closed at time $t_1$, the respective gains of the amplifying stage of the differential amplifier 14 and the amplifying stage of the operational amplifier 11 are set to 10°, the output voltages of the respective amplifying stages of the differential amplifier 14 and the operational amplifier 11 coincide with the input voltage $V_i$, and the capacitors 4 and 8 are charged at the voltage $V_i$.

Then, only the gain changing switch of the amplifying stage having a special negative feedback capacitor is opened at time $t_2$; that is, the switch 10 is kept closed and the switch 6 is opened. Consequently, the total gain of the variable-gain amplifying device is set to a value dependent on the capacitance ratio between the capacitors 4 and 5 (the gain $G_{14}$ of the amplifying stage of the differential amplifier 14) because the gain $G_{11}$ of the amplifying stage of the operational amplifier 11 is $10^\circ$. Noise generated when the switch 6 is opened is amplified at this gain and amplified noise appears at the output terminal 12. The amplified noise is indicated at $\Delta V_6$ in (e) of FIG. 7.

The switch 10 is opened at time $t_3$. Noise generated when the switch 10 is opened is amplified by the amplifying stage of the operational amplifier 11 and amplified noise appears at the output terminal 11. The amplified noise is indicated at $\Delta V_{10}$ in (e) of FIG. 7. Consequently, a voltage $V_{012}$ ($=V_i+\Delta V_6+\Delta V_{10}$) appears at the output terminal 12 as shown in (e) of FIG. 7 after the switch 10 has been opened. The voltage $V_{012}$ includes the amplified noise $\Delta V_6$ and $\Delta V_{10}$. Since part of the dynamic range of the variable-gain amplifying device is shared by the amplified noise, an available dynamic range is reduced. However, the reduction in the available dynamic range is small because of the following reasons.

If the switch 10 is opened before opening the switch 6, noise generated when the switch 6 is opened is amplified at the total gain $G_T$ of the variable-gain amplifying device and hence thus amplified noise is equal to $G_{11}$ times the amplified noise $\Delta V_6$, which is far greater than the amplified noise $\Delta V_6$. Thus, the influence of the noise on the output voltage can be reduced by opening the switch 6 before opening the switch 10.

The total output voltage $V_{o12}$ at the output terminal 12 including the noise can be reduced to a minimum when the respective gains $G_{14}$ and $G_{11}$ of the amplifying stages are equal to each other in a state where both the switches 6 and 10 are opened. When noise as generated is $\Delta S$, $\Delta V_6 = \Delta S \times G_{14}$ and $\Delta V_{10} = \Delta S \times G_{11}$. Therefore, $V_{o12} = \Delta S \times G_{14} + \Delta S \times G_{11} = \Delta S$ $(G_{14}+G_{11})$. Since $G_{14} \times G_{11} = G_T$ (constant) and two numbers the product of which is a fixed number and the sum of which is a minimum are equal numbers, $(G_{14}+G_{11})$ is a minimum when $G_{14}=G_{11}$. Therefore, it is preferable that the respective gains of the input amplifying stage and the output amplifying stage are equal to each other when both the switches 6 and 10 are open. In other words, it is preferable that the total gain in a state where the switch 6 is open and the switch 10 is closed is equal to the square root of the total gain in a state where both the switches 6 and 10 are open. Incidentally, when $G_{14}=10$, $G_{11}=10$ and $G_T=100$, the influence of the noise is only 10+10=20 instead of 100.

(2) Operation with Composite Signal of Bias Voltage and Input Signal

Suppose that an input signal $\Delta V$ is superposed on the bias voltage at time $t_4$. Then, only the input signal $\Delta V$ is amplified at the gain $G_T$ of the variable-gain amplifying device because the bias voltage is cancelled by the input capacitor 4, and a voltage obtained by superposing the voltage $V_{o12}$ on $G_T \times \Delta V$ appears at the output terminal 12.

Since the variable-gain amplifying device of FIG. 1 has only the differential amplifier 14 as the input amplifying stage, the open-circuit of the variable-gain amplifying device is smaller than that of a variable-gain amplifying device having two input amplifying stages and is able to secure easily a phase margin enough to prevent oscillation. Since the variable-gain amplifying device of FIG. 1 needs a less number of phase compensating capacitors than that employing two operational amplifiers, the cost of the former is lower than that of the latter. Since negative feedback is made for the differential amplifier when the gain is $10^\circ$ (0 dB) at which oscillation is most liable to occur, the variable-gain amplifying device is stabilized even if the differential amplifier, i.e., the input amplifying state, has a large transconductance $g_m$ to suppress noise.

Figure 8:
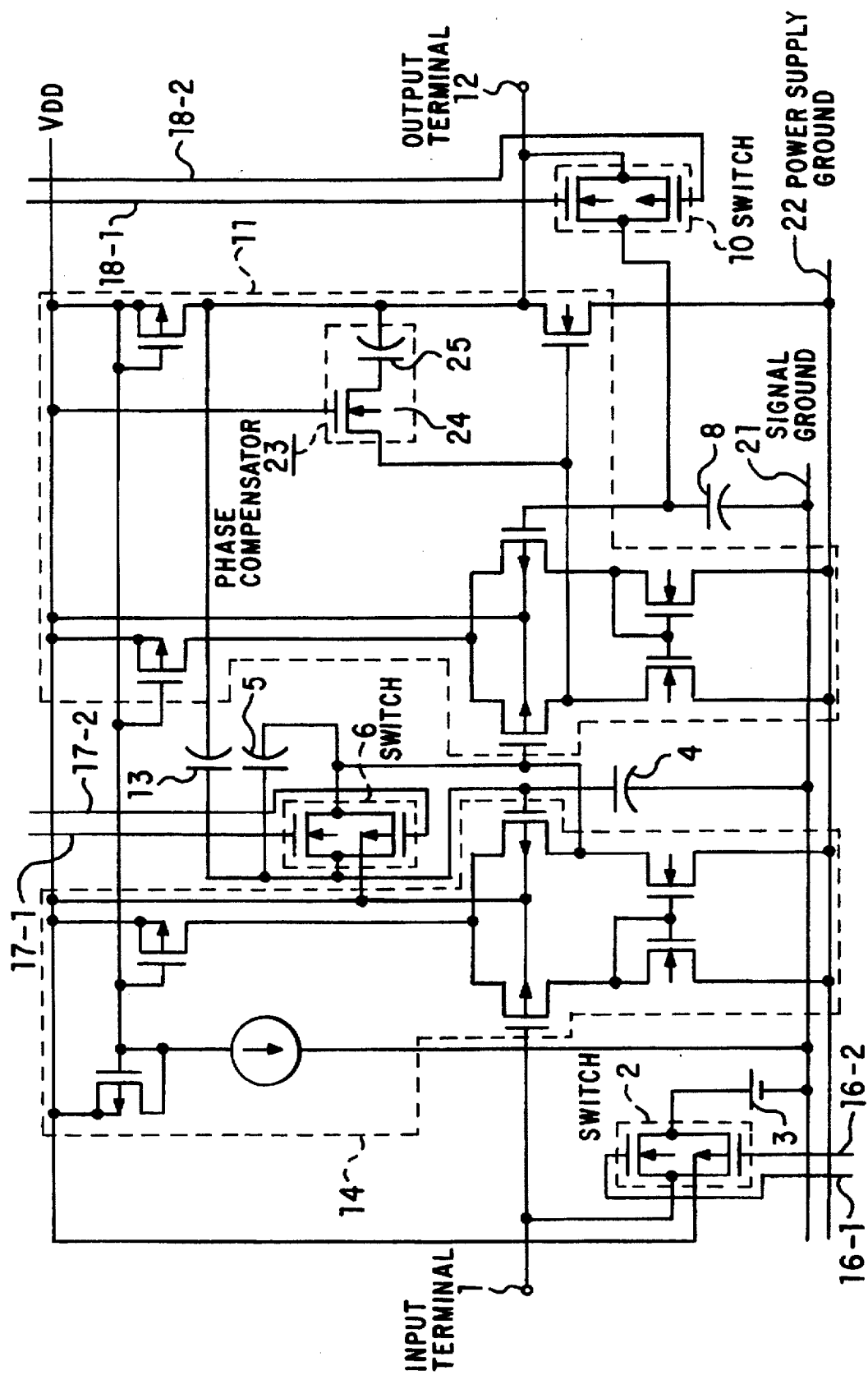
FIG. 8 is a circuit diagram of the variable-gain amplifying device embodying the present invention.

FIG. 8 shows a concrete circuit of the variable-gain amplifier of the present invention, in which parts like or corresponding to those shown in FIG. 1 are designated by the same reference characters. In FIG. 8, indicated at 16-1 and 16-2, 17-1 and 17-2, and 18-1 and 18-2 are pairs of switching signal lines, at 21 is a signal ground for signals, at 22 is a power source ground for the power source, at 23 is a phase compensator, at 24 is a MOSFET and at 25 is a capacitor. When a signal given to one of each pair of signal switching lines is HIGH, a signal given to the other is LOW.

The on-off operation of a switch comprising a CMOSFET will be explained in connection with the operation of the switch 2 by way of example. The switch 2 closes when the switching signal line 16-1 is HIGH and the switching signal line 16-2 is LOW, and the switch 2 opens when the state of the switching signal lines 16-1 and 16-2 is reversed.

The phase compensator 23 comprises the MOSFET 24 and the capacitor 25. A supply voltage $V_{DD}$ is applied to the gate of the MOSFET 24 and the MOSFET 24 serves as a resistor. In an operational amplifier employing a CMOSFET, in general, a resistor (nulling resistor) is connected in series to a phase compensating capacitor to shift the zero point of the transfer function to the left half of the s-plane. The MOSFET 24 serves also as such a resistor.

FIGS. 6A, 6B and 6C show equivalent circuits of assistance in explaining the behavior of a MOSFET. FIG. 6A shows an n-channel MOSFET 19 which is equivalent to a series circuit of a switch 19S and a resistor 19R. When a gate voltage applied to the gate is HIGH, the switch 19S is closed as shown in FIG. 6B and the MOSFET 19 behaves as a resistor 19R. When the voltage applied to the gate is LOW, the switch 19S is opened as shown in FIG. 6C and the MOSFET 19 is disconnected from the circuit.

(Interlocked Switching of Phase Compensator)

Figure 4:
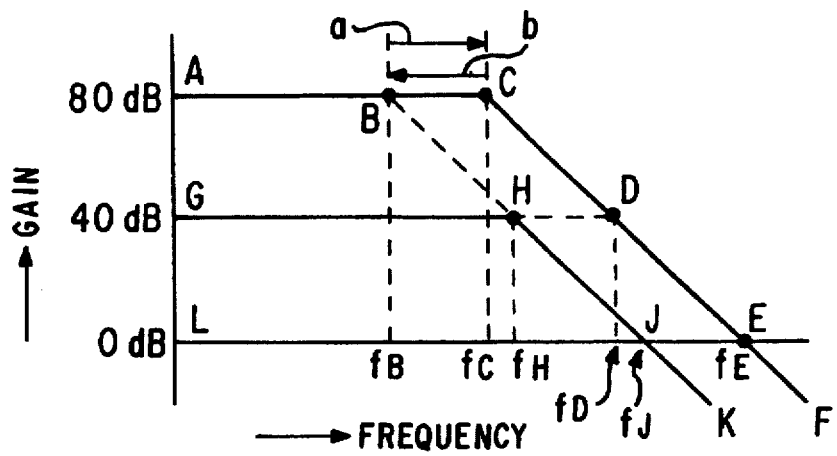
FIG. 4 is a diagram showing the gain characteristic of an operational amplifier.

When the phase compensator 23 included in the operational amplifier 11 of the variable-gain amplifying device performs a single type of phase compensation, the cutoff frequency $f_C$ is lowered when a greater gain is selected; that is, the frequency band signals that can be amplified at a predetermined gain is narrowed. The principle of such a phenomenon will be described with reference to FIG. 4 showing the gain characteristic of an operational amplifier, in which frequency is measured on the horizontal axis on logarithmic scale, and gain (dB) is measured on the vertical axis.

It is assumed herein that the gain of a CMOSFET operational amplifier is 80 dB when negative feedback is not made, the gain characteristic of the operational amplifier is represented by a curve A→B→C→D→E→F and the gain characteristic curve has a bend at a point C corresponding to a frequency $f_C$. When the gain is fixed at 80 dB, only signals of frequencies not higher than the frequency $f_C$ can be amplified. The frequency $f_C$ is the cutoff frequency.

The gain characteristic of an operational amplifier provided with a phase compensator is represented by a curve A→B→H→J→K. The shift of the cutoff frequency $f_C$ to a frequency $f_B$ lower than the cutoff frequency $f_C$ by the phase compensator entails the shift of the point C to a point B. The inclined section of the gain characteristic curve shifts in the direction of the arrow b when phase compensation is applied and shifts in the direction of the arrow a when phase compensation is removed.

As is generally known, the gain decreases when negative feedback is made. An operational amplifier not provided with any phase compensator has a gain characteristic as represented by a curve G→H→D→E →F when negative feedback is made for the operational amplifier so that its gain is 40 dB, and has a gain characteristic as represented by a curve L→J→E→F when negative feedback is made so that its gain is 0 dB.

An operational amplifier provided with a phase compensator has a gain characteristic as represented by a curve G→H→J→K when negative feedback is made for the operational amplifier so that its gain is 40 dB, and has a gain characteristic as represented by a curve L→J→K when negative feedback is made so that its gain is 0 dB.

When it is intended to change the gain of the variable-gain amplifying device between 40 dB and 0 dB, a negative feedback circuit for setting the gain to 40 dB and a negative feedback circuit for setting the gain to 0 dB are incorporated into the variable-gain amplifying device, and those negative feedback circuits are activated selectively. When the negative feedback circuits are switched on and off, the cutoff frequency, i.e., the frequency band of the variable-gain amplifying device, changes greatly.

Incidentally, the variable-gain amplifying device not provided with any phase compensator has a gain characteristic represented by a curve G→H→D→E→F and the cutoff frequency is $f_D$ corresponding to a point D when the gain is 40 dB, and has a gain characteristic represented by a curve L→E→F and the cutoff frequency is $f_E$ higher than the cutoff frequency $f_D$ when the gain is 0 dB. Since the horizontal axis is graduated on logarithmic scale, the actual difference between the cutoff frequencies $f_D$ and $f_E$ is very large. Thus, the cutoff frequency is reduced greatly when the gain is set to the larger one. Such a change in the cutoff frequency applies also to a state where the variable-gain amplifying device is provided with a phase compensator, in which the cutoff frequency is $f_H$ when the gain is 40 dB, and $f_J$ higher than $f_H$ when the gain is 0 dB.

As shown in FIG. 8, the problem that the cutoff frequency changes greatly when the gain is changed cannot be solved as long as the phase compensator performs only a single type of phase compensation. The variable-gain amplifying device as shown in FIG. 8 is acceptable provided that a great change in the cutoff frequency does not matter. However, it is expected, as a matter of course, that there is a demand for the reduction of change in the cutoff frequency to the least possible extent. The present invention further proposes a variable-gain amplifying device capable of switching a phase compensator simultaneously with gain changing to meet such a demand.

The principle of suppressing the change of the cutoff frequency by the switching of a phase compensator simultaneously with gain changing will be explained with reference to FIG. 4 and concrete examples of circuits necessary for suppressing the change of the cutoff frequency will be given.

Referring to FIG. 4, when phase compensation is applied to make the inclined section of the gain characteristic curve shift in the direction of the arrow b with the gain set to 0 dB, the cutoff frequency is $f_J$ corresponding to a point J. When phase compensation is removed simultaneously with the change of the gain from 0 dB to 40dB to make the inclined section of the gain characteristic curve shift in the direction of the arrow a, the cutoff frequency changes from $f_J$ to $f_D$ corresponding to the point D. The cutoff frequencies $f_J$ and $f_D$ are not greatly different from each other. Thus, the change in the cutoff frequency is smaller than that when the gain is changed without removing phase compensation.

Figure 5:
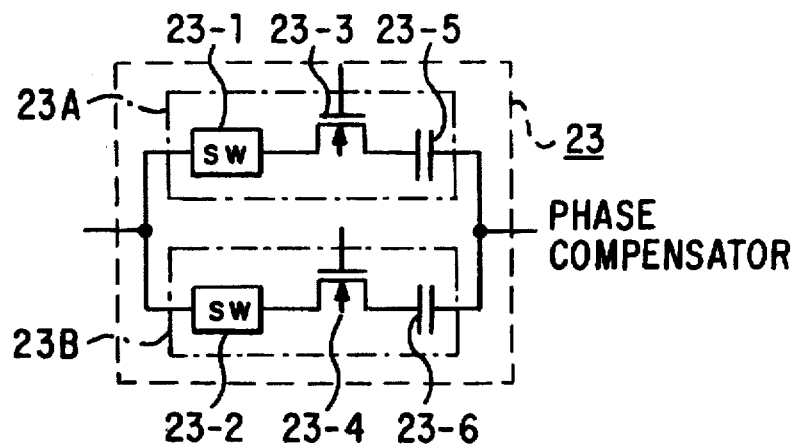
FIG. 5 is a circuit diagram of a switchable phase compensator.

A first mode of switching a phase compensator, switches on and off a plurality of phase compensating capacitors. FIG. 5 shows a phase compensator for such a mode of switching. Shown in FIG. 5 are a first phase compensating circuit 23A, a second phase compensating circuit 23B, switches 23-1 and 23-2, MOSFETs 23-3 and 23-4 and capacitors 23-5 and 23-6. The MOSFETs 23-3 and 23-4 serve as resistors. The switch 23-1 is closed to employ the first phase compensating circuit 23A when setting the gain to 40 dB, and the switch 23-2 is closed to employ the second phase compensating circuit 23B when setting the gain to 0 dB.

This phase compensator, however, needs the switches 23-1 and 23-2 and hence comprises a relatively large number of circuit elements. In the following embodiments of the present invention, a MOSFET, i.e., a nulling resistor, is used as both a circuit element and a switching element of a phase compensating circuit.

Figure 9:
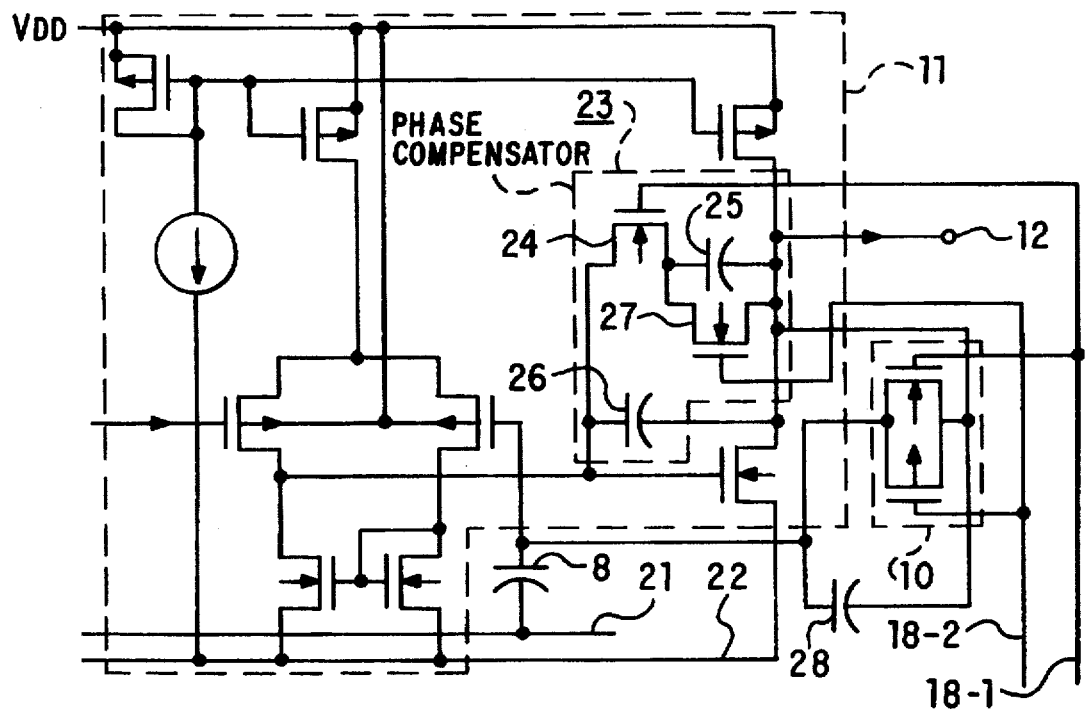
FIG. 9 is Example 1 of an operational amplifier that switches gains and a phase compensator.

FIG. 9 shows an operational amplifier 11 in Example 1 for switching a phase compensator simultaneously with gain changing, in which parts like or corresponding to those shown in FIG. 8 are designated by the same reference characters. In FIG. 9, indicated at 26 is a capacitor, at 27 is a MOSFET and at 28 is a capacitor. The capacitor 28 is an element of a negative feedback circuit which can be connected to the operational amplifier 11 when necessary. When the capacitor 28 is connected to the operational amplifier 11, the capacitor 28 is grounded when the switch 10 is closed, i.e., when setting the gain to 0 dB, and performs negative feedback when the switch 10 is opened.

A phase compensator 23 included in the operational amplifier 11 shown in FIG. 9 has a first phase compensating circuit comprising a capacitor 25 connected in parallel to the MOSFET 27, and a MOSFET 24, and a second phase compensating circuit comprising the capacitor 26, and connected in parallel to the first phase compensating circuit. The capacitor 26 serving as the second phase compensating circuit is kept connected, and only the first phase compensating circuit is connected and disconnected simultaneously with gain changing. Switching signals for controlling the gain changing switch 10 are applied to the gates of the MOSFETs 24 and 27, respectively, to switch the MOSFETs 24 and 27 simultaneously with gain changing.

① operation for Setting Gain to 0 dB

A switching signal of HIGH and a switching signal of LOW are applied to the switching signal lines 18-1 and 18-2, respectively, to close the switch 10. Since the switching signal of HIGH is applied also to the gate of the MOSFET 24, the MOSFET 24 is turned on and functions as a resistor. Since the switching signal of LOW is applied also to the gate of the MOSFET 27, the MOSFET 27 is turned off. Consequently, the parallel circuit of the first and the second phase compensating circuits functions for phase compensation.

② Operation for Setting Gain to 40 dB

A switching signal of LOW and a switching signal of HIGH are applied to the switching signal lines 18-1 and 18-2, respectively, to open the switch 10. Since the switching signal of LOW is applied also to the gate of the MOSFET 24, the MOSFET 24 is turned off. Consequently, only the capacitor 26 serving as the second phase compensating circuit functions for phase compensation. Since the switching signal of HIGH is applied also to the gate of the MOSFET 27, the MOSFET 27 is turned on. Consequently, the both terminals of the capacitor 25 are short-circuited.

When the MOSFET 24 is turned off and, subsequently, the potential of the output terminal 12 shifts to the negative side and, at the same time, the voltage at the terminal of the capacitor 25 on the side of the n-channel MOSFET 24 drops from the gate voltage of LOW to a voltage below the threshold voltage of the MOSFET 24, the MOSFET 24 cannot perfectly be opened, so that the MOSFET 24 continues phase compensation together with the capacitor 25. Since such an operation is equivalent to a switching operation for the greater gain, the cutoff frequency is reduced.

The MOSFET 27 is connected to the MOSFET 24 to prevent such a change in the cutoff frequency. In such a case, the MOSFET 27 is closed to short-circuit the capacitor 25, so that the MOSFET 24 is opened perfectly and the phase compensating action is prevented to prevent the reduction of the cutoff frequency. If the reduction of the cutoff frequency immediately after switching does not matter, the MOSFET 27 may be omitted.

Figure 10:
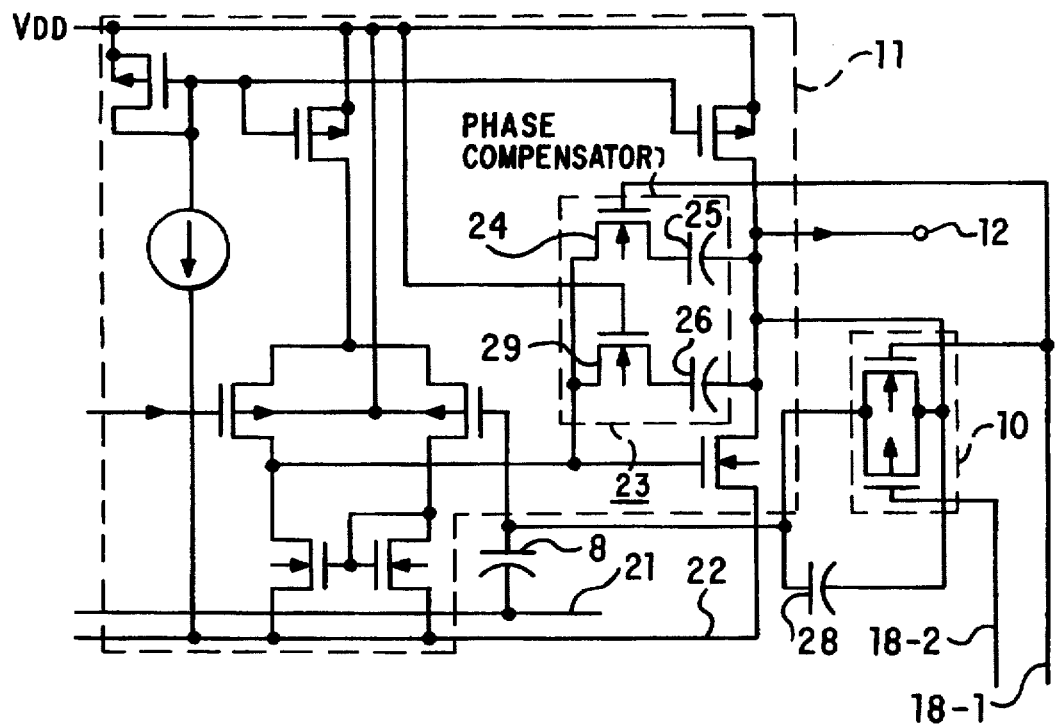
FIG. 10 is Example 2 of an operational amplifier that switches gains and a phase compensator.

FIG. 10 shows an operational amplifier 11 in Example 2 for switching a phase compensator simultaneously with gain changing, in which parts like or corresponding to those shown in FIG. 9 are designated by the same reference characters. In FIG. 10, indicated at 29 is a MOSFET. A supply voltage $V_{DD}$ is applied to the gate of the MOSFET 29 to use the MOSFET 29 as a fixed resistor. Example 2 of FIG. 10 differs from Example 1 of FIG. 9 in that the second phase compensating circuit comprises the capacitor 26 and the MOSFET 29 connected in series to the capacitor 26, which is a first difference, and Example 2 of FIG. 10 is not provided with any element corresponding to the MOSFET 27 of Example 1 of FIG. 9, which is a second difference.

Figure 11:
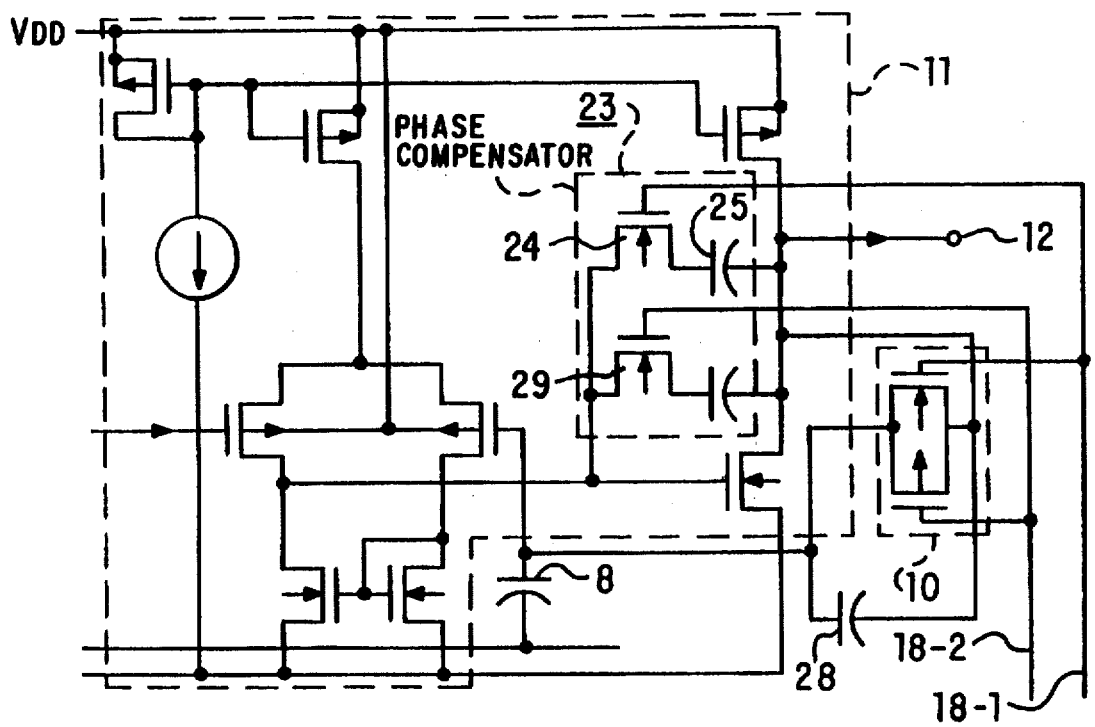
FIG. 11 is Example 3 of an operational amplifier that switches gains and a phase compensator.

FIG. 11 shows an operational amplifier 11 in Example 3 for switching a phase compensator simultaneously with gain changing, in which parts like or corresponding to those shown in FIG. 10 are designated by the same reference characters. Example 3 of FIG. 11 differs from Example 2 of FIG. 10 in that the MOSFET 29 is not used as a fixed resistor, opened when the switch 10 is closed (when the switching signal applied to the switching signal line 18-2 is LOW) and used as a resistor when the switch 10 is opened (when the switching signal applied to the switching signal line 18-2 is HIGH).

Figure 12:
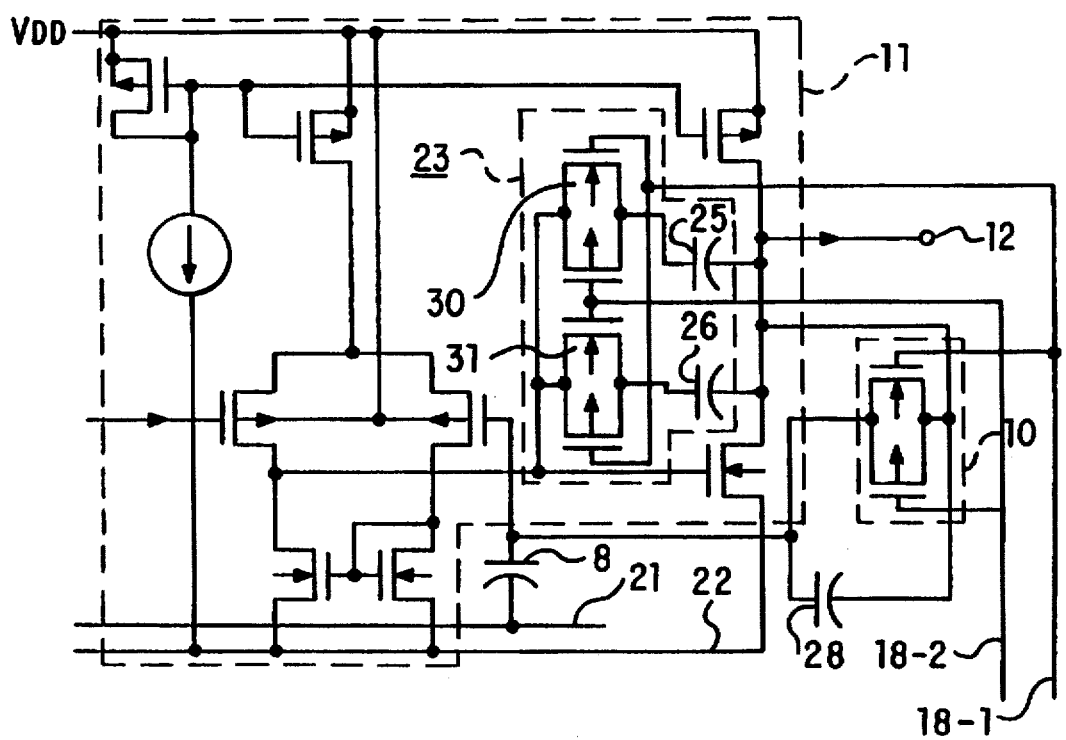
FIG. 12 is Example 4 of an operational amplifier that switches gains and a phase compensator.

FIG. 12 shows an operational amplifier 11 in Example 4 for switching a phase compensator simultaneously with gain changing, in which parts like or corresponding to those shown in FIG. 11 are designated by the same reference characters. In FIG. 12, indicated at 30 and 31 are CMOSFETs. The phase compensator 23 uses either the capacitor 25 or 26 when the gain is changed.

Figure 13:
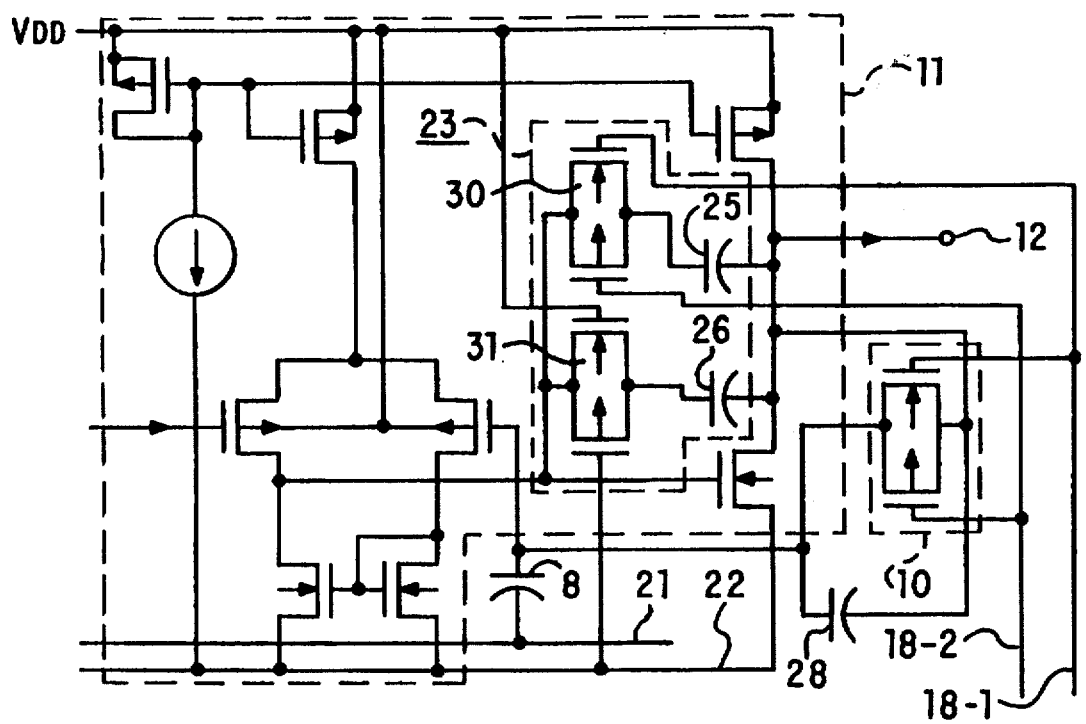
FIG. 13 is Example 5 of an operational amplifier that switches gains and a phase compensator.

FIG. 13 shows an operational amplifier 11 in Example 5 for switching a phase compensator simultaneously with gain changing, in which parts like or corresponding to those shown in FIG. 12 are designated by the same reference characters. The source voltage $V_{DD}$ and the power source ground 22 are connected to the gates of the n-channel and p-channel MOSFETs, respectively, of the CMOSFET 31, and the CMOSFET 31 is always in an ON-state. Therefore, the capacitor 26 is kept connected through the CMOSFET 31. Consequently, the phase compensator 23 uses only the capacitor 26 or the parallel circuit of the capacitors 25 and 26 for gain changing.

Figure 14:
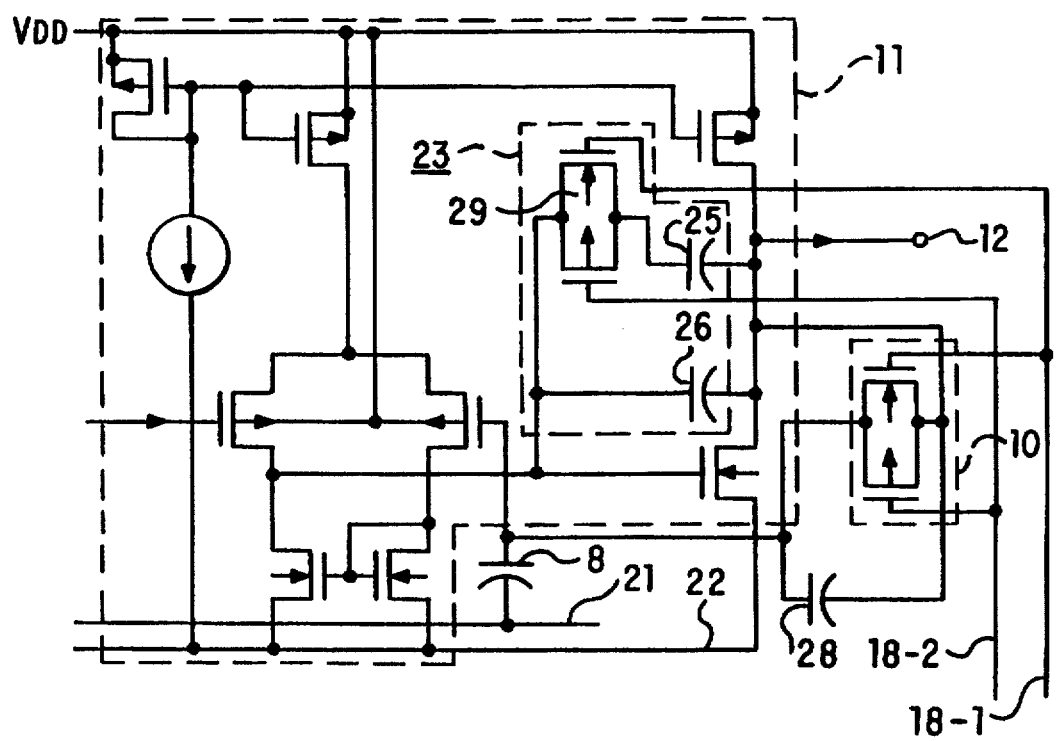
FIG. 14 is Example 6 of an operational amplifier that switches gains and a phase compensator.

FIG. 14 shows an operational amplifier 11 in Example 6 for switching a phase compensator simultaneously with gain changing, in which parts like or corresponding to those shown in FIG. 13 are designated by the same reference characters. Example 6 of FIG. 14 differs from Example 5 of FIG. 13 in that the capacitor 26 is connected directly to the circuit.

As is apparent from the foregoing description, the variable-gain amplifying device has the following effects.

① The capacitor for securing a phase margin may be of a small capacity. Since a cascade connection of a differential amplifier and an operational amplifier is employed instead of a cascade connection of two operational amplifiers, the loop gain equal to the remainder of subtraction of the actual gain obtained by negative feedback from the sum of the gains of the differential amplifier and the operational amplifier (the sum of open-circuit gains) is not excessively large. Therefore, the capacitance of the capacitor for securing a phase margin to prevent oscillation may be smaller than that of a capacitor necessary when two operational amplifiers are used, and the area for the capacitor and the costs are reduced.

② The shift of the output level due to switching noise can be suppressed. Since the switch for switching the gain of the input amplifying stage is opened with the switch for switching the gain of the operational amplifier, i.e., the output amplifying stage, closed (gain is 10°), noise generated when the same switch is opened is amplified only by the input amplifying stage and hence the thus amplified noise is far lower than amplified noise amplified by both the input and the output amplifying stages arranged in a cascade connection. The switch for changing the gain of the output amplifying stage is opened after the switch for changing the gain of the input amplifying stage has been opened and hence noise is amplified only by the output amplifying stage. Consequently, the shift of the output level due to switching noise can be limited to a low extent and hence an available dynamic range is increased accordingly.

③ Since negative feedback is made for the variable-gain amplifying device, noise generated by the output amplifying stage is suppressed.

④ Since negative feedback is made for the differential amplifier when the gain is 10° at which oscillation is liable to occur, a phase margin can be secured, the variable-gain amplifying device is stabilized and oscillation occurs hardly even if the differential amplifier of a large transconductance $g_m$ is employed to reduce noise.

⑤ Since the phase compensator of the operational amplifier, i.e., the output amplifying stage, is changed simultaneously with gain changing, the reduction of cutoff frequency is small even when a larger gain is selected.

⑥ When the phase compensator comprises the capacitor, and the nulling resistor of the operational amplifier connected in series to the capacitor, and the nulling resistor is controlled by the gain switching signal, any special switch for switching the phase compensator is not necessary.

Although the invention has been described in its preferred form with a certain degree of particularity, obviously many changes and variations are possible therein. It is therefore to be understood that the present invention may be practiced otherwise than as specifically described herein without departing the scope and spirit thereof.

What is claimed is:

1. A variable-gain amplifying device comprising:
   a first differential amplifier having a positive-phase input terminal to which an input voltage is applied;
   a first capacitor for negative feedback connected across the inverted input terminal and the output terminal of said first differential amplifier;
   a first switch connected in parallel to said first capacitor;
   a second capacitor connected across the inverted input terminal of said first differential amplifier and a point of a fixed potential;
   an operational amplifier having a differential amplifying stage and an output amplifying stage, and having a positive-phase input terminal connected to the output terminal of said first differential amplifier;
   a second switch for gain switching connected across the inverted input terminal and the output terminal of said operational amplifier;

a third capacitor connected across the inverted input terminal of said operational amplifier and a point of a fixed potential; and a fourth capacitor for negative feedback connected across the inverted input terminal of said first differential amplifier and the output terminal of said operational amplifier.

2. A variable-gain amplifying device according to claim 1, wherein said first and said second switches are MOSFET analog switches.

3. A variable-gain amplifying device according to claim 1, wherein the total gain in a state with said first switch opened and said second switch closed is approximately equal to the square root of the total gain in a state with both said first and said second switches opened.

4. A variable-gain amplifying device according to claim 1, wherein when opening said first and said second switches, said first switch is opened first.

5. A variable-gain amplifying device according to claim 1, further comprising a first phase compensating circuit for changing the phase of said operational amplifier, comprising a phase compensating capacitor and a first MOSFET, wherein the gate of said first MOSFET is controlled by a gain switching signal provided by operating said second switch for gain switching, said first phase compensating circuit changes the phase in response to the gain switching signal, and said first MOSFET acts together with said phase compensating capacitor as a nulling resistor for determining a cutoff frequency.

6. A variable-gain amplifying device according to claim 5, wherein a second MOSFET is connected in parallel to said phase compensating capacitor, and said second MOSFET is turned on when said first MOSFET is turned off.

7. A variable-gain amplifying device according to claim 5, further comprising a second phase compensating circuit connected in parallel to the first phase compensating circuit to set said variable-gain amplifying device in a phase compensating characteristic different from that set by said first phase compensating circuit.

8. A variable-gain amplifying device according to claim 7, wherein said first and said second phase compensating circuit are used selectively or in combination according to the gain switching signal.

9. A variable-gain amplifying device according to claim 7, wherein said second phase compensating circuit comprises only a capacitor.

* * * * *